United States Patent
Rice

(10) Patent No.: US 6,809,559 B2
(45) Date of Patent: Oct. 26, 2004

(54) METHOD OF FORMING A POWER DEVICE AND STRUCTURE THEREFOR

(75) Inventor: Benjamin M. Rice, Attleboro, MA (US)

(73) Assignee: Semiconductor Components Industries, L.L.C., Phoenix, AZ (US)

( * ) Notice: Subject to any disclaimer, the term of this patent is extended or adjusted under 35 U.S.C. 154(b) by 40 days.

(21) Appl. No.: 10/228,374

(22) Filed: Aug. 27, 2002

(65) Prior Publication Data

US 2004/0041151 A1 Mar. 4, 2004

(51) Int. Cl.[7] ............................................... H03K 3/00
(52) U.S. Cl. ...................................... 327/108; 327/377
(58) Field of Search ........................ 327/108–112, 377, 327/434, 436, 437

(56) References Cited

U.S. PATENT DOCUMENTS

| | | | | |
|---|---|---|---|---|
| 4,347,447 A | * | 8/1982 | Proebsting | 327/108 |
| 5,550,497 A | * | 8/1996 | Carobolante | 327/110 |
| 5,552,746 A | * | 9/1996 | Danstrom | 327/427 |
| 5,592,117 A | * | 1/1997 | Nadd | 327/374 |
| 6,476,649 B1 | * | 11/2002 | Goren et al. | 327/108 |

* cited by examiner

Primary Examiner—Kenneth B. Wells
(74) Attorney, Agent, or Firm—Robert F. Hightower

(57) ABSTRACT

A method of forming a power device (10) includes forming a power transistor (27) and a pull-down transistor (28) on a semiconductor die (36). The pull-down transistor (28) is enabled to rapidly and predictably disable the power transistor (27). The pull-down transistor (28) remains enabled for a first time period during the enabling of the power transistor (27) to facilitate rapidly and predictably enabling the power transistor (27).

14 Claims, 2 Drawing Sheets

METHOD OF FORMING A POWER DEVICE AND STRUCTURE THEREFOR

BACKGROUND OF THE INVENTION

The present invention relates, in general, to electronics, and more particularly, to methods of forming semiconductor devices and structures.

In the past, the semiconductor industry utilized various techniques for controlling metal oxide semiconductor (MOS) power transistors. MOS power transistors typically are large and dissipate a large of amount of power, thus, MOS power transistors generally were formed on a single semiconductor die. Typically, such power transistors were driven by semiconductor devices that were external to the power transistor. The driver transistors typically were smaller MOS transistors connected in a totem pole configuration to provide active pull-up and pull-down of the gate of the power transistor.

One problem with these methods and devices was inaccurate timing predictability. The MOS power transistor typically had a large gate capacitance and also had a large inductance due to the bonding wires connecting the gate to external pins. Because of this capacitance and inductance, it was difficult to quickly turn the power transistor on and to turn the power transistor off. This difficulty in turning the transistor on and off lowered the operating frequencies at which the transistor could be operated and also made it difficult to determine the precise time at which the power transistor would turn-on and would turn-off. Typically, a large gate driver or a higher gate voltage was used in order to turn the power transistor on. This larger gate driver or larger voltage increased the system cost.

Another problem was heat dissipation and power loss. The difficulty in turning the transistors on and off resulted in slow rise and fall times that increased the power dissipation of the transistors.

Additionally, it was difficult to maintain the power transistor in an off state. Because of the parasitic drain-to-gate capacitance, current could flow from the drain to the gate when the transistor was in an off-state. This current flow would charge the gate-to-drain capacitance thereby turning on the power transistor.

Accordingly, it is desirable to have a power transistor that has a short and predictable turn-on and turn-off time, that does not allow parasitic currents to affect the gate voltage, that does not require a higher voltage or large driver transistor, and that has a low system cost.

For simplicity and clarity of illustration, elements in the figures are not necessarily to scale, and the same reference numbers in different figures denote the same elements. Additionally, descriptions and details of well known steps and elements are omitted for simplicity of the description. As used herein current carrying electrode means an element of a device that carries current through the device such as a source or a drain of an MOS transistor or an emitter or a collector of a bipolar transistor, and a control electrode means an element of the device that controls current through the device such as a gate of an MOS transistor or a base of a bipolar transistor.

DETAILED DESCRIPTION OF THE DRAWINGS

The present description includes a method of forming a power device having, among other features, reduced turn-on and turn-off times, enhanced immunity to off-state transients, and predictable timing.

Figure 1:
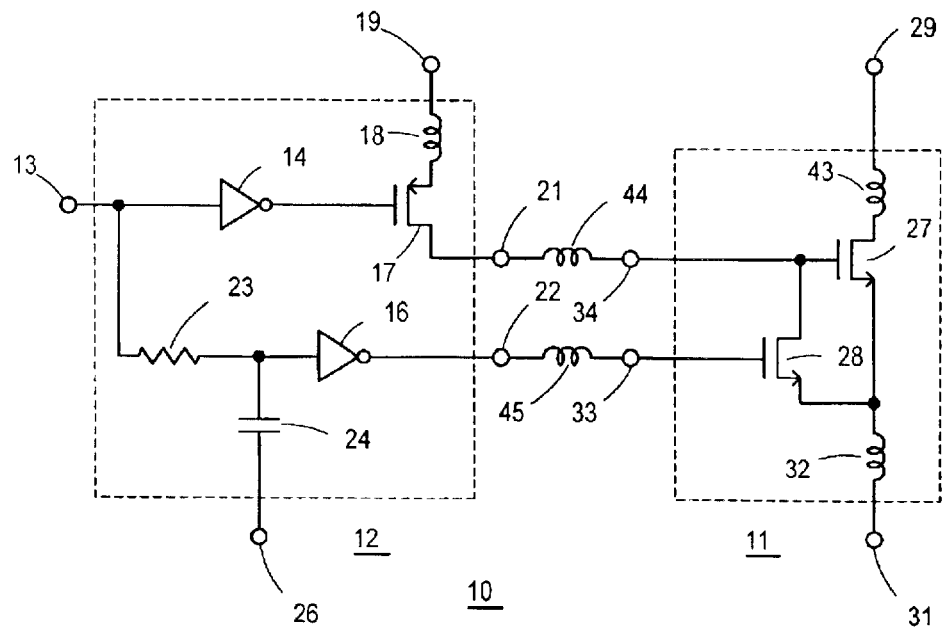
FIG. 1 is a schematic graphically illustrating a portion of an embodiment of an MOS power transistor circuit in accordance with the present invention.

FIG. 1 schematically illustrates a portion of an embodiment of a power device 10. Device 10 includes a power MOSFET 11 that is formed on a semiconductor die. Device 10 also includes a driver circuit 12 that is formed on a separate semiconductor die and is coupled to drive power MOSFET 11. In the preferred embodiment, power MOSFET 11 and driver circuit 12 are attached to a single leadframe and packaged in the same semiconductor package. In other embodiments, driver circuit 12 and power MOSFET 11 may be formed in different packaging arrangements including in separate packages.

Power MOSFET 11 includes a power transistor 27 and a pull-down transistor 28. Power MOSFET 11 typically is a large semiconductor device and generally is formed from a plurality of transistors connected in parallel. Transistor 28 generally is much smaller than transistor 27 and is used for, among other things, discharging the gate-to-drain capacitance of transistor 27 and for maintaining transistor 27 in an off state. In the preferred embodiment, transistors 27 and 28 are N-channel MOS transistors. Transistor 27 has a drain that is typically connected to an external terminal or external package pin or to a lead frame as illustrated by an input 29. An inductor 43 schematically illustrates the inductance of bonding wires utilized to form this connection. Transistor 27 also has a source that is typically connected to an external package pin or external electrode or to a lead frame as illustrated by a terminal 31. An inductor 32 schematically represents the inductance of bonding wires utilized to connect the source to terminal 31. A gate of transistor 27 typically is connected to a first input 34 of power MOSFET 11. Input 34 may be an external terminal or a lead frame or a package pin. An inductor 44 schematically illustrates a lumped inductance representing the distributed inductances of bonding wires utilized to connect the gate to input 34 in addition to bonding wires utilized in circuit 12.

Transistor 28 is connected across or between the gate and source of transistor 27 and is utilized, among other things, to discharge the gate-to-source capacitance of transistor 27. A drain of transistor 28 is connected to the gate of transistor 27, a source of transistor 28 is connected to the source of transistor 27, and a gate of transistor 28 is connected to a second input 33 of power MOSFET 11. An inductor 45 schematically illustrates a lumped inductance representing the distributed inductances of bonding wires utilized to connect the gate of transistor 28 to input 33 in addition to bonding wires utilized in circuit 12. Transistor 28 is formed on the same die with transistor 27 so that transistor 28 may drive transistor 27 directly without parasitic inductances affecting the timing relationships between transistors 27 and 28. This method for forming transistors 27 and 28 provides more accurate timing control over transistor 27 and provides more predictable timing characteristics for MOSFET 11. As can be see in FIG. 1, inductors 32 and 44 are external to the connections between transistors 27 and 28. Thus, the large currents required to discharge the gate of transistor 28 do not go through inductors 32 and 44.

Driver circuit 12 provides control signals that are utilized to enable and disable transistor 27. Driver circuit 12 has an input 13 that receives an input signal and circuit 12 responsively provides a first output signal or a pull-up signal on a first output 21 and also responsively provides a second output signal or a pull-down signal on a second output 22. The pull-up signal on output 21 typically is coupled to input 34 of MOSFET 11 and is utilized to enable transistor 27. The pull-down signal on output 22 typically is coupled to input 33 of MOSFET 11 and is utilized to enable transistor 28 which disables transistor 27. Driver circuit 12 also includes a pull-up transistor 17 that provides the pull-up signal. Transistor 17 is driven by a first amplifier 14 that has an input connected to receive the input signal on input 13, and also has an output connected to a gate of transistor 17. In the preferred embodiment, transistor 17 is a P-channel transistor and amplifier 14 is formed as a chain of inverters with each inverter having successively larger output transistors in order to amplify the signal received on input 13 sufficiently to drive transistor 17. Transistor 17 has a source connected to a power input 19 and a drain connected to output 21. Typically, input 19 is an external terminal or external package pin or a lead frame. Input 19 may be connected to input 29 or may be connected to a separate power source (not shown). The value of the voltage applied to input 19 is selected to ensure that transistor 27 can be enabled. An inductor 18 represents the bonding wire inductance resulting from connecting transistor 17 to input 19. An amplifier 16 is utilized to form the pull-down signal. Amplifier 16 receives the input signal from input 13 and drives output 22 with the pull-down signal. Amplifier 16 is formed similarly to amplifier 14. The input signal from input 13 is applied to the input of amplifier 16 through a delay network that delays applying the input signal to amplifier 16. The delay network has an input connected to input 13 and an output connected to the input of amplifier 16. Amplifier 16 also has an output connected to output 22. In the preferred embodiment, the delay network is a resistor 23 and a capacitor 24 but the delay network may have other implementations in other embodiments. Resistor 23 has a first terminal connected to input 13 and a second terminal connected to the input of amplifier 16, and capacitor 24 has a first terminal connected to the input of amplifier 16 and a second terminal connected to return 26.

In operation, transistor 17 generally is utilized to enable transistor 27, and transistor 28 is utilized to disable transistor 27. The state of the signal applied to input 13 reflects the state of transistor 27. For example when the input signal is a logic 1, the output of amplifier 14 is a logic zero and transistor 17 is enabled applying the value of the voltage on input 19 to the gate of transistor 27 thereby enabling transistor 27. For this state, the output of amplifier 16 is a logic zero, thus, transistor 28 is disabled and does not affect transistor 27. When the input signal applied to input 13 transitions to a logic zero, the output of amplifier 14 becomes a logic 1 thereby disabling transistor 17. The input signal is delayed by the delay network, thus, the output of amplifier 16 goes to a logic one after a first time period defined by the delay network. In the preferred embodiment, the first time period ranges between about three to ten nano-seconds (3–10 nsec.). After the first time period, the output of amplifier 16 goes to a logic one thereby enabling transistor 28 which discharges the gate capacitance of transistor 27 thereby turning transistor 27 off. Forming transistor 28 on the same die with transistor 27 facilitates transistor 28 rapidly turning-off transistor 27 without delays resulting from inductors 32 and 44. This reduces the turn-off delay of MOSFET 11 by a factor of about five (5) compared to other transistors thereby improving the timing predictability of MOSFET 11. Forming transistor 28 on the same die with transistor 27 also reduces the fall time of the output signal of MOSFET 11 by a factor of about ten (10) thereby reducing the switching power dissipation of MOSFET 11.

Additionally, transistor 28 remains enabled while the input signal to input 13 is a zero. Without transistor 28 being enabled, transients or other rapid increases in the drain voltage of transistor 27 during the off-state could cause current to flow from the drain to the gate of transistor 27 through a parasitic drain-to-gate capacitance. This current flow could charge a parasitic gate-to-source capacitance and begin enabling transistor 27. Consequently, keeping transistor 28 enabled during the time that transistor 27 is disabled, assists in ensuring that transistor 27 remains disabled and cannot be enabled due to parasitic currents or parasitic elements. If transistor 28 were on a different die than transistor 27, the parasitic inductances from bonding wires and interconnections may result in higher susceptibility to drain voltage transients that may be able to enable transistor 27.

When the input signal on input 13 goes from a logic zero to a logic one, the output of amplifier 14 goes to a zero thereby enabling transistor 17 to apply a high voltage to output 21 and input 34. Before the voltage on the gate of transistor 27 can increase there must be a large change of current through inductor 44 in order to change the voltage on the gate-to-source capacitance of transistor 27. Thus, transistor 27 does not turn on immediately but the enabling is delayed due to inductor 44. However, transistor 28 remains enabled because the delay network has delayed the input signal to amplifier 16. Consequently, there is a current path from transistor 17 through inductor 44 and through transistor 28. This current path allows inductor 44 to quickly develop a high current since it is not impeded by a voltage across MOSFET 11. Without transistor 28, such a voltage could be induced by a gate-to-source voltage from transistor 27 or a drain-to-source current from transistor 27 flowing through inductor 32. After the first time period, amplifier 16 receives the input signal and disables transistor 28. When transistor 28 turns off, a high voltage rapidly develops at the gate of transistor 27 which causes transistor 27 to turn-on faster because of the energy stored in inductor 44 by the higher current that was flowing through inductor 44. Forming transistor 28 on the same die with transistor 28 and delaying the signal to transistor 28 facilitates the faster turn-on time because transistor 28 is connected directly to transistor 27 and inductor 44 is not between the two transistors. This reduces the output signal rise time of MOSFET 11 by a factor of about two (2) compared to other transistors thereby reducing switching power dissipation, and also improving the turn-on predictability by a factor of about two to three (2–3).

Figure 2:
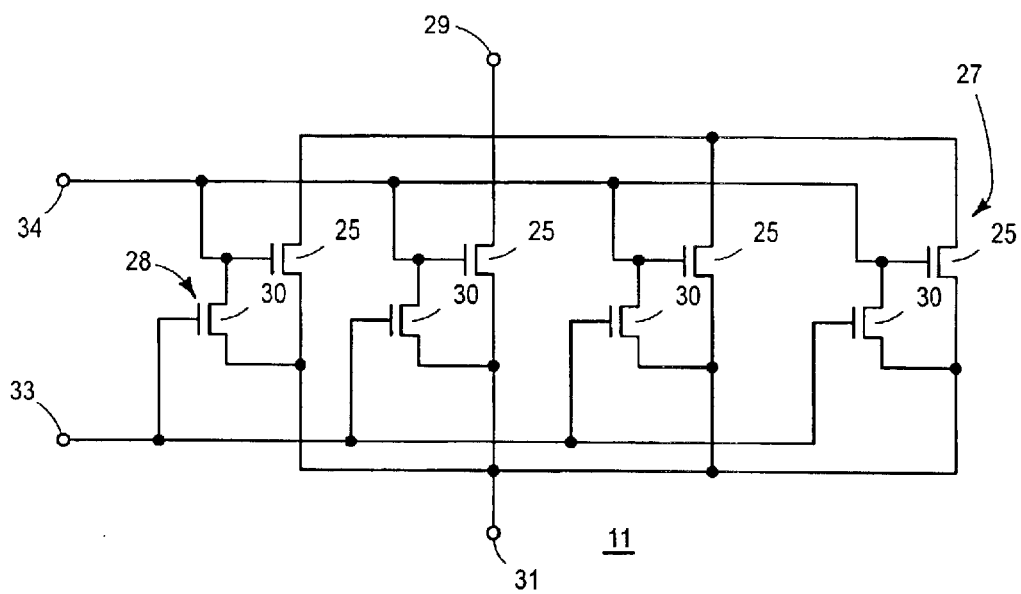
FIG. 2 is a schematic graphically illustrating an embodiment of a portion of a power MOSFET in accordance with the present invention.

FIG. 2 schematically illustrates a further detailed schematic of an embodiment of a portion of MOSFET 11. Power transistor 27 typically has several transistors that are connected in parallel on a semiconductor die to form transistor 27. FIG. 2 illustrates a portion of a plurality of transistors 25 that may be used in forming transistor 27. Each transistor 25 of plurality of transistors 25 is connected in parallel to form transistor 27. A much greater number of transistors 25 are connected to form of MOSFET 11 than the number shown in FIG. 2. In some embodiments, as many as one thousand (1000) or more transistors may be connected in parallel. In one embodiment, transistor 28 is formed as a smaller transistor 30 connected between the gate and source of each transistor 27. Thus, transistor 28 is formed from a plurality of transistors 30. In other embodiments transistor 28 may be formed as a smaller number of transistors connected to transistors 25. Those skilled in the art will understand that FIG. 2 is merely a schematic representation to further explain the concept of MOSFET 11.

Figure 3:
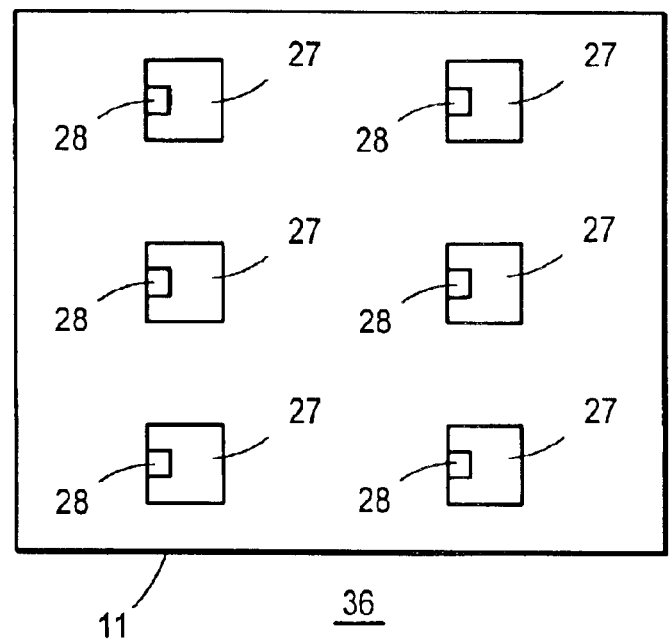
FIG. 3 schematically illustrates an enlarged plan view of a portion of an embodiment of a semiconductor die in accordance with the present invention.

FIG. 3 schematically illustrates an enlarged plan view of a portion of an embodiment of a semiconductor die 36 on which MOSFET 11 is formed including transistor 27 and transistor 28.

Figure 4:
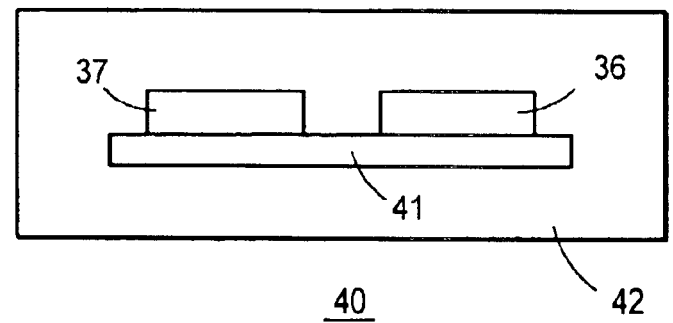
FIG. 4 schematically illustrates a cross-sectional portion of an embodiment of a semiconductor package in accordance with the present invention.

FIG. 4 schematically illustrates a cross-sectional portion of an embodiment of a semiconductor package 40 in which MOSFET 11 and circuit 12 are packaged. Package 40 includes a leadframe 41 on which die 36 (FIG. 3) is attached. Also attached is a semiconductor die 37 on which circuit 12 is formed. An encapsulating material 42 is formed around leadframe 41 to facilitate forming package 40.

In view of all of the above, it is evident that a novel device and method is disclosed. Included, among other features, is forming a pull-down transistor on the same die with a power transistor and forming the pull-up transistor on a separate die. Also included is a method of keeping the pull-down signal enabled to facilitate enabling the pull-up transistor and the pull-down transistor during the same time period to reduce the turn-on time.

While the invention is described with specific preferred embodiments, it is evident that many alternatives and variations will be apparent to those skilled in the semiconductor arts. More specifically the invention has been described for a particular N-channel and P-channel MOS transistors, although the method is directly applicable to bipolar transistors, as well as to BiCMOS, metal semiconductor FETs (MESFETs), HFETs, and other transistor structures.

What is claimed is:

1. A method of forming a power device comprising:

forming a power transistor and a pull-down transistor on a first semiconductor die;

coupling the pull-down transistor across a gate and a source of the power transistor;

coupling the gate of the power transistor to a first input of the power device;

coupling a gate of the pull-down transistor to a second input of the power device; and forming a driver circuit having a first amplifier coupled to receive an input signal and responsively drive a pull-up transistor coupled to a first output of the driver circuit and having a second amplifier coupled to receive the input signal and responsively drive a second output of the driver circuit wherein the driver circuit is formed on a second semiconductor die and wherein the first output of the driver circuit is configured for coupling to the first input of the power device and the second output of the driver circuit is configured for coupling to the second input of the power device.

2. The method of claim 1 wherein forming the power transistor and the pull-down transistor on the first semiconductor die includes forming a plurality of power transistors on the first semiconductor die and forming a plurality of pull-down transistors coupled across the gate and a source of the plurality of power transistors.

3. The method of claim 2 wherein coupling the gate of the power transistor to the first input of the power device includes coupling the gate of the plurality of power transistors to the first input.

4. The method of claim 2 wherein coupling the gate of the pull-down transistor to the second input of the power device includes coupling the gate of the plurality of pull-down transistors to the second input.

5. The method of claim 1 wherein forming the second amplifier coupled to receive the input signal includes coupling the input signal to the second amplifier through a delay network.

6. A method of forming a power MOSFET comprising:

forming a power transistor and a pull-down transistor on a first semiconductor die;

coupling the pull-down transistor between a gate and a source of the power transistor;

forming a driver circuit on a second semiconductor die wherein the driver circuit includes a first amplifier coupled to receive an input signal and responsively drive a pull-up transistor coupled to a first output of the driver circuit to apply a first signal to the first output and also includes a second amplifier coupled to receive the input signal and responsively drive a second output of the driver circuit to apply a second signal to the second output;

enabling the pull-down transistor to disable the power transistor; and applying the first signal to enable the power transistor and applying the second signal to the pull-down transistor and disabling the pull-down transistor a first time after applying the first signal.

7. The method of claim 6 wherein forming the power transistor and the pull-down transistor on the first semiconductor die includes forming a plurality of power transistors coupled in a parallel configuration and forming a plurality of pull-down transistors coupled to the plurality of power transistors.

8. The method of claim 6 wherein forming the power transistor and the pull-down transistor on the first semiconductor die includes coupling a gate of the power transistor to a first input of the power MOSFET and coupling a gate of the pull-down transistor to a second input of the power MOSFET.

9. The method of claim 6 further including delaying the input signal received by the second amplifier.

10. A power MOSFET comprising:

a first semiconductor die;

a power transistor having a gate that is coupled to a first input of the power MOSFET and having a source wherein the power transistor is formed on the first semiconductor die; and a pull-down transistor coupled across the gate and the source of the power transistor and having a gate that is coupled to a second input of the power MOSFET wherein the pull-down transistor is formed on the first semiconductor die;

a driver circuit on a second semiconductor die and configured to be coupled to the first semiconductor die, the driver circuit having a first amplifier coupled to receive an input signal and responsively drive a pull-up transistor coupled to a first output of the driver circuit an having a second amplifier coupled to receive the input signal and responsively drive a second output of the driver circuit wherein the first output of the driver circuit is configured to be coupled to the first input of the power MOSFET and the second output of the driver circuit is configured to be coupled to the second input of the power MOSFET.

11. The power MOSFET of claim 10 wherein the power transistor and the pull-down transistor include a plurality of power transistors coupled in parallel and a plurality of pull-down transistors coupled across the gate and the source of the plurality of power transistors.

12. The power MOSFET of claim 11 wherein each gate of the plurality of power transistors is coupled to a first input of the power MOSFET.

13. The power MOSFET of claim 12 wherein each gate of the plurality of pull-down transistors is coupled to a second input of the power MOSFET.

14. The power MOSFET of claim 10 wherein the second amplifier coupled to receive the input signal includes the input signal coupled to the second amplifier through a delay network.

* * * * *